United States Patent
Lee et al.

(10) Patent No.: US 9,929,576 B2
(45) Date of Patent: Mar. 27, 2018

(54) METHOD, DEVICE, AND ADAPTOR FOR DYNAMICALLY ADJUSTING CHARGING CURRENT OF ADAPTOR TO ACHIEVE THERMAL PROTECTION AND FAST CHARGING

(71) Applicant: MEDIATEK INC., Hsin-Chu (TW)

(72) Inventors: Chien-Lung Lee, Hsinchu (TW); Chih-Chien Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 171 days.

(21) Appl. No.: 14/782,331

(22) PCT Filed: Jun. 3, 2014

(86) PCT No.: PCT/CN2014/079100
§ 371 (c)(1),
(2) Date: Oct. 5, 2015

(87) PCT Pub. No.: WO2014/194811
PCT Pub. Date: Dec. 11, 2014

(65) Prior Publication Data
US 2016/0049804 A1    Feb. 18, 2016

Related U.S. Application Data

(60) Provisional application No. 61/830,486, filed on Jun. 3, 2013.

(51) Int. Cl.
*H01M 10/44* (2006.01)
*H01M 10/46* (2006.01)
(Continued)

(52) U.S. Cl.
CPC ........ *H02J 7/0044* (2013.01); *G01R 31/3679* (2013.01); *H02J 7/007* (2013.01);
(Continued)

(58) Field of Classification Search
CPC ........ H02J 7/0021; H02J 7/007; H02J 7/0081; H02J 7/0083
(Continued)

(56) References Cited

U.S. PATENT DOCUMENTS 5,684,382 A    11/1997  Fritz
2009/0051329 A1  2/2009  Ashida
(Continued)

FOREIGN PATENT DOCUMENTS

CN    1858963 A    11/2006
CN    1862911 A    11/2006
(Continued)

OTHER PUBLICATIONS

"International Search Report" dated Aug. 29, 2014 for International application No. PCT/CN2014/079099, International filed: Jun. 3, 2014.
(Continued)

*Primary Examiner* — Edward Tso
(74) *Attorney, Agent, or Firm* — Winston Hsu

(57) ABSTRACT

A method, device and adaptor for dynamically adjusting charging current of the adaptor to achieve thermal protection and fast charging. The method includes the steps of: checking whether the adaptor is capable of providing a target current for a battery connected to a charger device, and generating a check result; and according to the check result, making the adaptor to adjust a charging voltage provided by the adaptor from a first voltage to a second voltage so as to adjust the charging current supplied by the adaptor.

17 Claims, 2 Drawing Sheets

(51) Int. Cl.
*H02J 7/00* (2006.01)
*H02J 7/04* (2006.01)
*G01R 31/36* (2006.01)

(52) U.S. Cl.
CPC ............ *H02J 7/0057* (2013.01); *H02J 7/045* (2013.01); *H02J 7/047* (2013.01); *H02J 2007/0096* (2013.01)

(58) Field of Classification Search
USPC ......... 320/107, 159, 162; 307/72, 73, 74, 75
See application file for complete search history.

(56) References Cited

U.S. PATENT DOCUMENTS

2010/0301813 A1 12/2010 Esnard
2011/0006731 A1 1/2011 Wang
2012/0217935 A1 8/2012 Hawawini
2013/0082643 A1 4/2013 Cha
2013/0234655 A1* 9/2013 Miwa .................... H02J 7/0004
  320/107

FOREIGN PATENT DOCUMENTS

| CN | 1877954 A | 12/2006 |
| CN | 101507082 A | 8/2009 |
| CN | 101752883 A | 6/2010 |
| CN | 101958563 A | 1/2011 |
| CN | 102013705 A | 4/2011 |
| EP | 2 503 660 A1 | 9/2012 |
| JP | 2003169476 A | 6/2003 |

OTHER PUBLICATIONS

"International Search Report" dated Sep. 3, 2014 for International application No. PCT/CN2014/079100, International filed: Jun. 3, 2014.

* cited by examiner

METHOD, DEVICE, AND ADAPTOR FOR DYNAMICALLY ADJUSTING CHARGING CURRENT OF ADAPTOR TO ACHIEVE THERMAL PROTECTION AND FAST CHARGING

FIELD OF INVENTION

The present invention relates to a charging scheme for controlling an adaptor, and more particularly to a charging scheme for dynamically adjusting charging current of an adaptor.

BACKGROUND OF THE INVENTION

Generally speaking, the storage capacity of a battery nowadays becomes larger and larger, and it is usually to employ a large charging current to charge the battery so as to decrease the waiting time for charging the battery. However, due to limitations of circuit elements within a conventional charger and a conventional adaptor, the conventional adaptor actually cannot supply a rated maximum charging current or even a large charging current to the battery via the conventional charger. In addition, an over large charging current may cause the circuit elements of the conventional charger thermally damaged. Accordingly, considering both of thermal protection and fast charging, it is necessary and important to provide a novel scheme for obtaining an appropriate charging current to charge the battery.

SUMMARY OF THE INVENTION

Therefore one of the objectives of the present invention is to provide a charging system, a charger device, and a method for dynamically adjusting a charging current supplied by an adaptor by adjusting the charging voltage so as to obtain an appropriate charging current and solve the above-mentioned problems.

According to an embodiment of the present invention, a method for adjusting a charging current supplied by an adaptor is disclosed. The method comprises: checking whether the adaptor is capable of providing a target current for a battery connected to a charger device, to generate a check result; and according to the check result, making the adaptor to adjust a charging voltage provided by the adaptor from a first voltage to a second voltage so as to adjust the charging current supplied by the adaptor.

According to an embodiment of the present invention, a device for adjusting a charging current supplied by an adaptor is disclosed. The device comprises a sensor and a controller. The sensor is utilized for sensing a current corresponding to the charging current supplied by the adaptor. The controller is coupled to the sensor and utilized for checking whether the adaptor is capable of providing a target current for a battery connected to the device, to generate a check result. The controller is arranged to make the adaptor to adjust a charging voltage provided by the adaptor from a first voltage to a second voltage according to the check result, so as to adjust the charging current supplied by the adaptor.

According to an embodiment of the present invention, an adaptor for supplying a charging current to a charger is disclosed. The adaptor comprises a controller at least. The controller is utilized for adjusting a charging voltage provided by the adaptor from a first level to a second level according to a charging current supplied by the adaptor and a target current for a battery charged by the adaptor.

According to the above-mentioned embodiments, by dynamically adjusting the charging current and charging voltage of an adaptor, the charging system, charger device, and corresponding method can achieve the advantages of thermal protection and fast charging, to effectively improve the efficiency of the charger device and reduce the whole waiting time for charging a battery.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
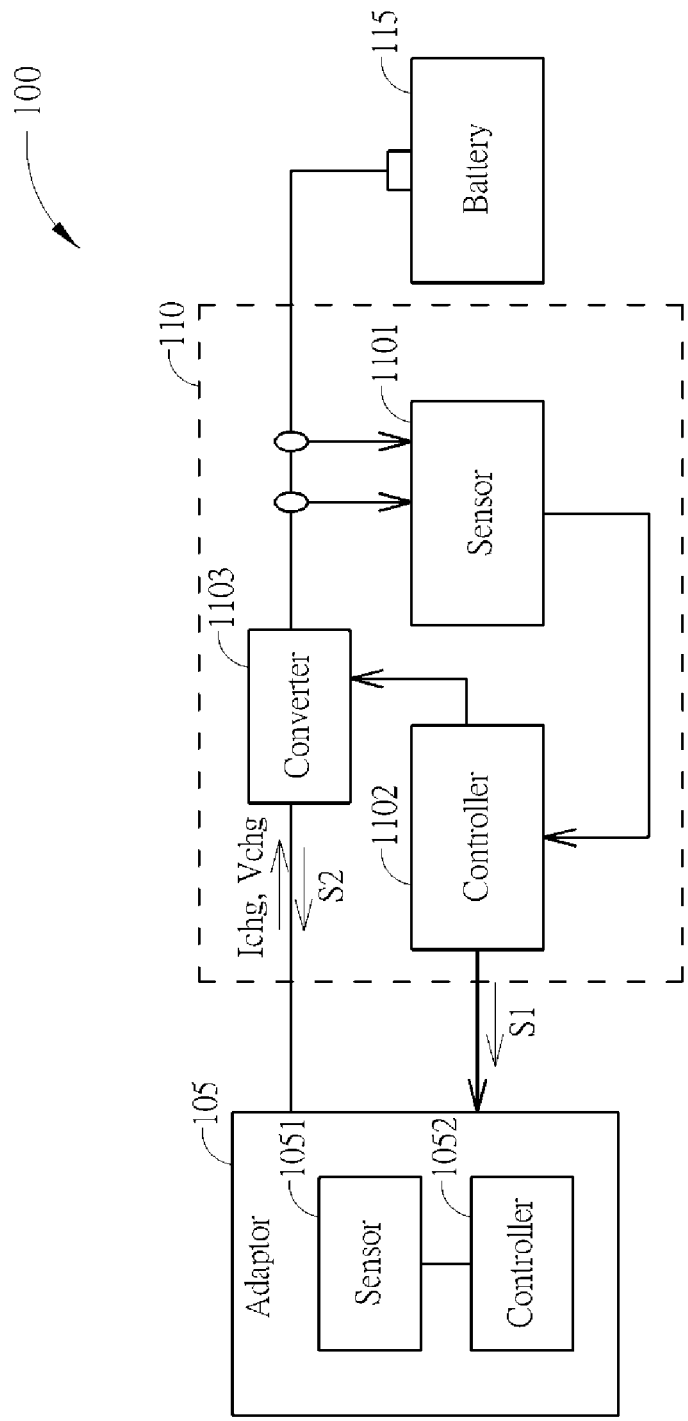
FIG. 1 is a block diagram of a charging system according to an embodiment of the present invention.

Please refer to FIG. 1, which is a block diagram of a charging system 100 according to an embodiment of the present invention. The charging system 100 comprises an adaptor 105 and a charger device 110. The charging system 100 is capable of dynamically adjusting the charging current Ichg actually supplied/provided by the adaptor 105 to a battery 115 connected to the charger device 110 according to a control signal S1 and/or a message S2 sent by the charger device 110. The charging system 100 can be used for increasing the charging current Ichg provided by the adaptor 105 as far as possible, to achieve the purpose of fast charging. That is, the charging system 100 can effectively decrease or reduce the whole waiting time for charging the battery 115.

Specifically, the adaptor 105 is arranged to supply the charging current Ichg to the charger device 110, and the charger device 110 is arranged to charge the battery 115 according to the charging current Ichg. The charger device 110 comprises a sensor 1101, a controller 1102, and a converter 1103. The converter 1103 is arranged to convert the charging current Ichg to generate a current flowing into the battery 115. The charging current Ichg may be equal to or may be not equal to the current flowing into the battery 115, and the charging voltage Vchg may be equal to or may be not equal to a voltage actually provided for the battery 115 (i.e. a voltage level of the battery 115). In practice, the converter 1103 can be implemented by using a buck converter, a boost converter, a buck-boost converter, or a bipolar junction transistor (BJT). The converter 1103 is controlled by the controller 1102. The sensor 1101 is used for sensing a current corresponding to the charging current Ichg where this current can indicate the current flowing into the battery 115, a current passing through the charger device 110, or a current flowing into the charger device 110 (i.e. the charging current Ichg). In this embodiment, the sensor 1101 is used for sensing (but not limited) the current flowing into the battery 115. Since the current flowing into the battery 115 corresponds to the charging current Ichg, by sensing the current flowing into the battery 115, the charging current Ichg can be also equivalently estimated.

The controller 1102 is coupled to the sensor 1101 and converter 1103 and is arranged to configure a target current outputted from the adaptor 105 as a first current. The level of target current is configurable. It should be noted that the level of target current of an adaptor configured by the charger device 110 may be not equal to the charging current Ichg that can be actually provided by such adaptor due to that a higher and undesired voltage drop may cause the voltage level actually provided to the battery 115 becomes lower or a rated value of charging current Ichg of this adaptor is lower than the level of target current configured by the charger device 110. When the adaptor 105 is connected to charger device 110 for charging the battery 115, the charger device 110 may configure the target current of the adaptor 105. After configuring the target current, the controller 1102 is arranged to check whether the adaptor 105 is capable of supplying/providing the first current (i.e. the target current) to the charger device 110 according to a sensed result from the sensor 1101, so as to generate a check result. The controller 1102 can estimate whether the adaptor 105 can actually provide the target current that has been configured by the charger device 110. It should be noted that the controller 1102 may also estimate whether the adaptor 105 can provide some current or not without needing to configure the target current of adaptor 105. That is, the operation for configuring the target current of adaptor 105 is not intended to be a limitation of the present invention.

If the check result shows that the adaptor 105 actually is capable of supplying/providing the target current to the charger device 110, the controller 1102 is arranged to control the adaptor 105 to lower the charging voltage Vchg so as to increase the charging current Ichg. That is, this makes the adaptor 105 adjust the charging voltage Vchg from a first voltage to a second voltage to as to adjust the charging current Ichg. The controller 1102 can transmit the control signal S1 to notify the adaptor 105 of how to adjust the charging voltage Vchg. This scheme is preferred when the adaptor 105 includes a DC-DC converter. In addition, to notify the adaptor 105 of how to adjust the charging voltage Vchg, the controller 1102 can control the converter 1103 to transmit a voltage adjusting message S2 to the adaptor 105 by controlling the converter 1103 to generate current variation(s) on the interface between the converter 1103 and the adaptor 105. Accordingly, via the control signal S1 and/or the voltage adjusting message S2, the adaptor 105 can be aware of voltage adjusting for the charging voltage Vchg.

In this embodiment, the adaptor 105 comprises a sensor 1051 and a controller 1052. The control signal S1 and the voltage variation(s) and/or current variation(s) are transmitted to the adaptor 105 via a connecting interface of the adaptor 105. The sensor 1051 is used for sensing current variation and/or voltage variation on the connecting interface, and then sending the sensed result to the controller 1052 to notify controller 1052 of the voltage adjusting message S2. That is, the sensor 1051 notifies the controller 1052 of adjusting the charging voltage Vchg according to its sensed result. In addition, the sensor 1051 is used for receiving the control signal S1 transmitted on the connecting interface by charger device 110, and notifying the controller 1052 of adjusting the charging voltage Vchg according to the received control signal S1. Thus, the controller 1052 is capable of adjusting the charging voltage Vchg provided by the adaptor 105 from the first level to the second level according to the charging current Ichg supplied by the adaptor 105 and the target current for the battery 115. The controller 1052 is arranged to lower the charging voltage Vchg so as to make the adaptor 105 lower the charging voltage Vchg when the adaptor 105 is capable of providing the target current, and to heighten the charging voltage Vchg so as to make the adaptor 105 heighten the charging voltage Vchg when the adaptor 105 is not capable of providing the target current. The operation of checking whether adaptor 105 is capable of providing the target current for battery 115 and the operation of making adaptor 105 to adjust charging voltage Vchg can be performed iteratively to search for a minimum charging voltage Vchg for adaptor 105 to provide the target current.

The charger device 110 may control the adaptor 105 to lower the charging voltage Vchg so as to gradually increase the charging current Ichg outputted from the adaptor 105 as far as possible until the adaptor 105 is not capable of supplying the increased charging current Ichg and/or the charger device 110 may control the adaptor 105 to keep/maintain the previously adjusted charging current Ichg when the adaptor 105 is not capable of supplying the increased charging current Ichg. For the adaptor 105, the controller 1052 iteratively adjusts the charging voltage Vchg for searching for a minimum level for the adaptor 105 to provide the target current. For example, the controller 1102 may configure the target current as 1 A, and the controller 1102 checks whether the adaptor 105 is capable of supplying the current of 1 A to the charger device 110 for charging the battery 115. If the adaptor 105 is capable of supplying the current of 1 A, then the controller 1102 may control the adaptor 105 to increase the charging current Ichg from 1 A to 1.2 A by sending the control signal S1 and/or the signal S2 to the adaptor 105, and may check whether the adaptor 105 is capable of supplying the current of 1.2 A to the charger device 110. In this situation, when receiving the control signal S1 and/or the voltage adjusting message S2, the controller 1052 of adaptor 105 increases the charging current Ichg by lowering the level of charging voltage Vchg. If the adaptor 105 is capable of supplying the current of 1.2 A, then the controller 1102 may control the adaptor 105 to increase the charging current Ichg from 1 A to 1.4 A or other currents, and so on. The controller 1102 may control the adaptor 105 to increase the charging current Ichg to 1.8 A and checks whether the adaptor 105 is capable of supplying the current of 1.8 A to the charger device 110. If the adaptor 105 actually is not capable of supplying the current of 1.8 A, the controller 1102 is arranged to control the adaptor 105 to keep/maintain the previously adjusted charging current Ichg such as 1.6 A as the charging current Ichg outputted from the adaptor 105 to the charger device 110. Accordingly, by dynamically making the adaptor 105 to adjust the level of charging voltage Vchg to adjust the charging current Ichg and checking whether an adaptor is capable of actually supplying the adjusted charging current Ichg, the charger device 110 can effectively increase the charging current Ichg that can be actually supplied by an adaptor, to preferably maximize the charging current Ichg that can be actually supplied by an adaptor.

In addition, in other embodiments, the value of target current may be configured as a higher value such as 2 A. The controller 1102 estimates whether the adaptor 105 actually can provide the current of 2 A that has been configured by the charger device 110. If the adaptor 105 is not capable of supplying the target current of 2 A to the charger device 110, the controller 1102 is arranged to control the adaptor 105 to gradually heighten the level of charging voltage Vchg that provided by the adaptor 105 so that there is opportunity for the adaptor 105 to provide the charging current Ichg which is slightly lower than the target current of 2 A. That is, once an adaptor actually cannot supply a higher current for the charger device 110, the charger device 110 can control this adaptor to try to supply the slightly lower charging current Ichg by heightening the charging voltage Vchg provided by the adaptor. The charger device 110 may control the adaptor 105 to gradually increase the level of charging voltage Vchg outputted from the adaptor 105 as far as possible until the adaptor 105 is capable of supplying the charging current Ichg corresponding to the increased level of charging voltage Vchg. The charger device 110 may control the adaptor 105 to keep/maintain the finally adjusted charging current Ichg when the adaptor 105 is capable of supplying the adjusted charging current Ichg. For example, when the controller 1102 configures the target current of the adaptor 105 as 2 A, and the controller 1102 checks whether the adaptor 105 actually is capable of supplying the current of 2 A to the charger device 110 for charging the battery 115. In this example, the level of charging voltage corresponding to the target current of 2 A is equal to 2.5 Volts. If the adaptor 105 actually is not capable of supplying the current of 2 A due to a higher voltage drop consumption, the controller 1102 may increase the level of charging voltage Vchg from 2.5 Volts to 2.7 Volts. The controller 1102 controls the adaptor 105 to try output the current of 1.8 A as the charging current Ichg in response to the level 2.7 Volts of the charging voltage Vchg. If the adaptor 105 is not capable of supplying the current of 1.8 A to the charger device 110 for charging the battery 115, the controller 1102 may increase the level of charging voltage Vchg from 2.7 Volts to 3.12 Volts so that the adaptor 105 can try output the current of 1.6 A as the charging current Ichg in response to the level 3.12 Volts of the charging voltage Vchg. If the adaptor 105 actually is capable of supplying the current of 1.6 A to the charger device 110, the controller 1102 is arranged to control the adaptor 105 to keep/maintain the charging voltage Vchg that has been adjusted and the corresponding charging current Ichg such as 1.6 A. Accordingly, by dynamically adjusting the level of charging voltage Vchg and checking whether an adaptor is capable of actually supplying a charging current corresponding to the adjusted level of charging voltage Vchg, the charger device 110 can effectively determine the value of charging current that can be actually supplied by an adaptor, to preferably maximize the charging current that can be actually supplied by an adaptor. This scheme also solves the problem caused by the higher voltage drop consumption.

In addition, the above-mentioned scheme of gradually increasing the value of charging current from a lower value to obtain the value of charging current that can be actually supplied by an adaptor and the scheme of gradually heightening the level of charging voltage to obtain the value of charging current that can be actually supplied by an adaptor can be integrated in other embodiments. This modification also falls within the scope of the present invention.

Figure 2:
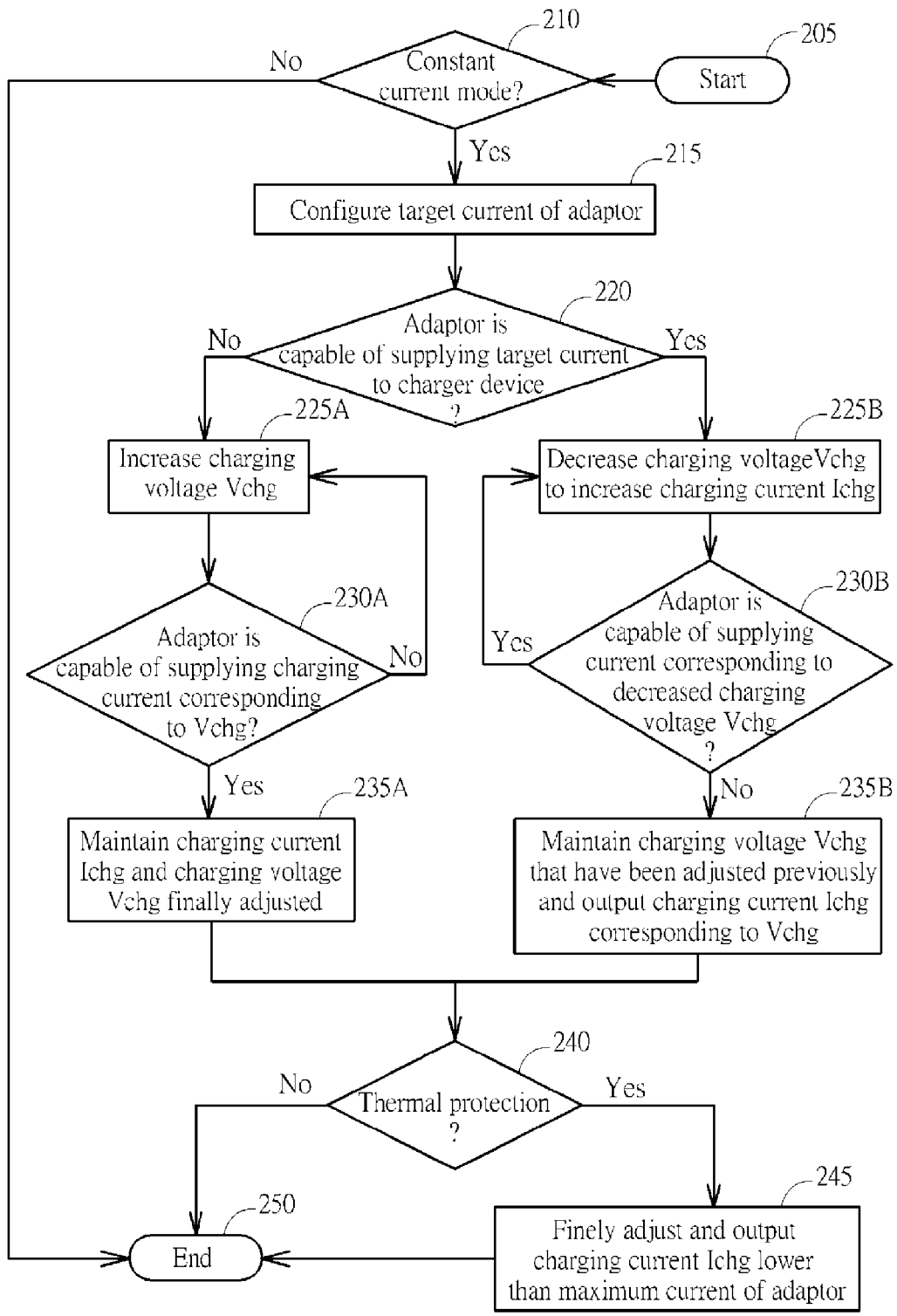
FIG. 2 is a flowchart of the operations of the charger device as shown in FIG. 1.

In order to more clearly describe the spirit of the present invention, FIG. 2 illustrates a flowchart of the operations of the charger device 110 as shown in FIG. 1. Provided that substantially the same result is achieved, the steps of the flowchart shown in FIG. 2 need not be in the exact order shown and need not be contiguous, that is, other steps can be intermediate. The steps are detailed in the following:

Step 205: Start;

Step 210: The controller 1102 checks whether the charger device 110 is in a constant current mode. If the charger device 110 is in the constant current mode, the flow proceeds to Step 215; otherwise, the flow proceeds to Step 250;

Step 215: The controller 1102 configures the target current of the adaptor 105; the value of target current may be higher or lower than the maximum value of current which can be supplied by the adaptor 105;

Step 220: The controller 1102 checks whether the adaptor 105 is capable of supplying the target current to the charger device 110 for charging the battery 115. If the adaptor 105 is not capable of providing the target current, the flow proceeds to Step 225A; otherwise, the flow proceeds to Step 225B;

Step 225A: The controller 1102 controls the adaptor 105 to increase the charging voltage Vchg of the adaptor 105 so as to try to output a smaller charging current;

Step 230A: The controller 1102 checks whether the adaptor 105 is capable of supplying the smaller charging current to the charger device 110 for charging the battery 115. If the adaptor 105 is not capable of providing the smaller charging current, the flow proceeds to Step 225A; otherwise, the flow proceeds to Step 235A;

Step 235A: The controller 1102 controls the adaptor 105 to maintain the charging current Ichg and charging voltage Vchg that are finally adjusted;

Step 225B: The controller 1102 controls the adaptor 105 to decrease the charging voltage Vchg of the adaptor 105 so as to increase the charging current Ichg that can be actually provided by the adaptor 105 as far as possible;

Step 230B: The controller 1102 checks whether the adaptor 105 is capable of supplying the current corresponding to the decreased charging voltage Vchg to the charger device 110 for charging the battery 115. If the adaptor 105 is capable of providing the current, the flow proceeds to Step 225B; otherwise, the flow proceeds to Step 235B;

Step 235B: The controller 1102 controls the adaptor 105 to maintain the charging voltage Vchg that have been adjusted previously and output the charging current Ichg corresponding to this charging voltage Vchg;

Step 240: The controller 1102 controls the sensor 1101 to detect whether it is needed to perform a thermal protection by sensing the temperature of the charger device 110. If it is needed to perform the thermal protection, the flow proceeds to Step 245; otherwise, the flow proceeds to Step 250;

Step 245: The controller 1102 controls the adaptor 105 to finely adjust and output the charging current Ichg that is lower than the value of the maximum current that can be supplied by the adaptor 105; and Step 250: End.

As mentioned above, in Step 220, the controller 1102 is arranged to check whether the adaptor 105 can actually provide the value of the target current that has been configured by the charger device 110. That is, the controller 1102 equivalently is arranged to check whether the target current is higher than the maximum charging current that can be actually provided by the adaptor 105. If the value of the charging current Ichg that actually can be supplied from the adaptor 105 does not meet the value of target current configured by the charger device 110, this indicates that the value of target current is over higher than the maximum current which actually can be provided by the adaptor 105, and accordingly the controller 1102 is arranged to find the maximum current which actually can be provided from the adaptor 105 by dynamically adjusting the level of charging voltage Vchg of the adaptor 105.

In practice, the controller 1102 may find the maximum current that can be provided from the adaptor 105 by making the adaptor 105 to gradually increase the level of charging voltage Vchg so that the adaptor 105 can output the maximum current which actually can be provided from the adaptor 105 when the level of charging voltage Vchg is increased to a corresponding higher level. It should be noted that the controller 1102 is arranged to configure the value of target current by selecting one value from a rated range of current which ideally can be provided by the adaptor 105. In some situations, the adaptor 105 may not output the value of target current when the target current is configured as a higher value in order to achieve fast charging, and the adaptor 105 can find the maximum current which actually can be provided from the adaptor 105 by dynamically adjusting the level of charging voltage Vchg of the adaptor 105. Thus, the controller 1102 can control the adaptor 105 to keep and maintain the value of charging current Ichg at the maximum current which actually can be provided by the adaptor 105. This achieves the purpose of fast charging.

In addition, when the value of target current initially configured by the controller 1102 is lower than the value of current which actually can be provided by the adaptor 105, the controller 1102 is arranged to control the adaptor 105 to increase the value of charging current Ichg provided from the adaptor 105 by gradually decreasing the level of charging voltage Vchg from the adaptor 105. The controller 1102 may control the adaptor 105 to lower the level of charging voltage Vchg to try to increase the value of charging current Ichg outputted from the adaptor 105 until the adaptor 105 actually cannot output the increased value of current. The controller 1102 is arranged to select the value of charging current Ichg before last adjusted, and control the adaptor 105 to keep and maintain the value of charging current Ichg at the selected charging current for charging the battery 115. By doing this, the controller 1102 can find the maximum current which actually can be outputted by the adaptor 105 to charge the battery 115. That is, whether the value of target current is configured to be higher or lower, the controller 1102 can find the maximum current which actually can be outputted by the adaptor 105. It is not necessary for the controller 1102 to configure the value of the target current initially. In other embodiments, even though the value of the target current is not configured initially, the controller 1102 can find the maximum current which actually can be outputted from the adaptor 105 by dynamically adjusting the level of charging voltage Vchg of the adaptor 105. Equivalently, in this situation, the adaptor 105 iteratively searches for a minimum charging voltage Vchg corresponding to a maximum charging current that can be provided from the adaptor 105.

Further, it should be noted that the operation of thermal protection is also not intended to be a limitation of the present invention. In addition, the type of the adaptor 105 is not intended to a limitation of the present invention. The adaptor 105 can be an AC-to-DC adaptor or a DC-to-DC converter. In addition, the charger device 110 can be a linear mode charger device, a buck mode charger device, or a switching mode charger device. This is not meant to be a limitation of the present invention.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A method for adjusting a charging current supplied by an adaptor, comprising:
   checking whether the adaptor is capable of providing a target current for a battery connected to a charger device, to generate a check result; and
   according to the check result, making the adaptor to adjust a charging voltage provided by the adaptor from a first voltage to a second voltage so as to adjust the charging current supplied by the adaptor;
   wherein the step of making the adaptor to adjust the charging voltage comprises:
   generating a current/voltage variation on a connecting interface between the adaptor and the charger to notify the adaptor to adjust the charging voltage by the adaptor itself.

2. The method of claim 1, wherein the step of making the adaptor to adjust the charging voltage further comprises:
   when the adaptor is capable of providing the target current for the battery, making the adaptor to lower the charging voltage provided by the adaptor; and
   when the adaptor is not capable of providing the target current for the battery, making the adaptor to heighten the charging voltage provided by the adaptor.

3. The method of claim 1, wherein the step of checking whether the adaptor is capable of providing the target current for the battery and the step of making the adaptor to adjust the charging voltage are performed iteratively to search for a minimum charging voltage for the adaptor to provide the target current.

4. The method of claim 1, wherein the step of making the adaptor to adjust the charging voltage further comprises:
   sending a control signal to adjust the charging voltage.

5. The method of claim 1, wherein the step of checking whether the adaptor is capable of providing the target current for the battery to generate the check result comprises:
   sensing a current flowing into the battery.

6. The method of claim 1, further comprising:
   configuring a level of the target current.

7. A device for adjusting a charging current supplied by an adaptor, comprising:
   a sensor, for sensing a current corresponding to the charging current supplied by the adaptor; and
   a controller, coupled to the sensor, for checking whether the adaptor is capable of providing a target current for a battery connected to the device, to generate a check result;
   wherein the controller is arranged to make the adaptor to adjust a charging voltage provided by the adaptor from a first voltage to a second voltage according to the check result, so as to adjust the charging current supplied by the adaptor; the controller generates a current/voltage variation on a connecting interface of the adaptor to notify the adaptor to adjust the charging voltage by the adaptor itself.

8. The device of claim 7, wherein when the adaptor is capable of providing the target current for the battery, the controller is arranged to make the adaptor to lower the charging voltage provided by the adaptor; and, when the adaptor is not capable of providing the target current for the battery, the controller is arranged to make the adaptor to heighten the charging voltage provided by the adaptor.

9. The device of claim 7, wherein the controller iteratively checks whether the adaptor is capable of providing the target current for the battery and makes the adaptor to adjust the charging voltage to search for a minimum charging voltage for the adaptor to provide the target current.

10. The device of claim 7, wherein the controller sends a control signal to adjust the charging voltage provided by the adaptor.

11. The device of claim 7, wherein the sensor senses a current flowing into the battery.

12. The charger device of claim 7, wherein the controller is arranged to configure a level of the target current.

13. An adaptor for supplying a charging current to a charger, comprising:
   a controller, for adjusting a charging voltage provided by the adaptor from a first level to a second level according to a charging current supplied by the adaptor and a target current for a battery charged by the adaptor and a sensor, coupled to the controller, for sensing a current/voltage variation on a connecting interface of the adaptor, and notifying the controller to adjust the charging voltage by the adaptor itself according to the sensed result.

14. The adaptor of claim 13, wherein the controller lowers the charging voltage provided by the adaptor when the adaptor is capable of providing the target current for the battery, and heightens the charging voltage provided by the adaptor when the adaptor is not capable of providing the target current for the battery.

15. The adaptor of claim 13, wherein the controller iteratively adjusts the charging voltage for searching for a minimum charging voltage for the adaptor to provide the target current.

16. The adaptor of claim 13, further comprising:

a sensor, coupled to the controller, for receiving a control signal on a connecting interface of the adaptor, and notifying the controller to adjust the charging voltage accordingly.

17. The adaptor of claim 13, wherein a level of the target current is configurable.

* * * * *